US010416215B2

(12) United States Patent
Beaty et al.

(10) Patent No.: US 10,416,215 B2
(45) Date of Patent: Sep. 17, 2019

(54) ESD TESTER

(71) Applicant: ExtraTech Systems, LLC, Dallas, TX (US)

(72) Inventors: Christopher Wilson Beaty, Post Falls, ID (US); Dennis Lee Johnson, Spokane, WA (US); Richard Steve Lane, Spirit Lake, ID (US)

(73) Assignee: ExtraTech Systems, LLC, Dallas, TX (US)

( * ) Notice: Subject to any disclaimer, the term of this patent is extended or adjusted under 35 U.S.C. 154(b) by 304 days.

(21) Appl. No.: 15/360,115

(22) Filed: Nov. 23, 2016

(65) Prior Publication Data
US 2017/0146579 A1 May 25, 2017

Related U.S. Application Data

(60) Provisional application No. 62/386,299, filed on Nov. 25, 2015.

(51) Int. Cl.
G01R 29/12 (2006.01)
G01R 27/14 (2006.01)
H05F 3/04 (2006.01)
G01R 31/00 (2006.01)

(52) U.S. Cl.
CPC ............ G01R 29/12 (2013.01); G01R 27/14 (2013.01); G01R 31/001 (2013.01); H05F 3/04 (2013.01)

(58) Field of Classification Search
CPC ...... G01R 29/12; G01R 31/001; G01R 27/14; H05F 3/04
USPC ................................. 324/457, 537
See application file for complete search history.

(56) References Cited

U.S. PATENT DOCUMENTS

| 4,638,399 | A | 1/1987 | Maroney et al. |
| 5,051,732 | A | 9/1991 | Robitaille |
| 5,057,965 | A | 10/1991 | Wilson |
| 6,052,053 | A | 4/2000 | Jubin et al. |
| 6,078,875 | A | 6/2000 | Jubin et al. |
| 6,809,522 | B2 | 10/2004 | Nguyen |
| 6,930,612 | B1 * | 8/2005 | Kraz .................... G08B 21/185 340/649 |
| 2010/0019914 | A1 * | 1/2010 | Lin .......................... A61N 1/08 340/649 |
| 2011/0081022 | A1 | 4/2011 | Tamm et al. |
| 2013/0226476 | A1 | 8/2013 | Samreth et al. |
| 2013/0289901 | A1 | 10/2013 | Samreth |
| 2014/0176153 | A1 | 6/2014 | Liu |

OTHER PUBLICATIONS

International Search Report and Written Opinion dated Feb. 7, 2017 in PCT/US2016/063522, 14 pages.

* cited by examiner

Primary Examiner — Farhana A Hoque
(74) Attorney, Agent, or Firm — Foley & Lardner LLP

(57) ABSTRACT

This disclosure is focused upon electrostatic discharge (ESD) control programs and more particularly an ESD testing device that performs electrostatic discharge (ESD) device efficacy verification in real time as it is being used. The results in some embodiments can be recorded for an ESD auditing program. The real time verification of the calibration of the unit includes circuitry for verification of the accuracy of the ESD device. The unit also includes a conically shaped guide to assist a user in plugging their wrist strap band connector into the device and also prevents a user from bypassing the testing unit by inserting digits into the ESD testing device rather than the wrist strap band connector.

17 Claims, 3 Drawing Sheets

ESD TESTER

CROSS-REFERENCE TO RELATED APPLICATION

This application claims the benefit of and priority to U.S. Provisional Patent Application No. 62/386,299, filed on Nov. 25, 2015, and incorporated by reference herein in its entirety.

FIELD OF THE INVENTION

This disclosure is related to testing modules that are used to make sure that electrostatic discharge (ESD) control programs are regularly monitored to assure that the ESD program remains effective over time.

BACKGROUND

One of the requirements of any quality ESD control program is to minimize the voltage charge that can exist on operators relative to electronic products and surroundings. A poor program can cause damage to expensive equipment due to operators carrying a charge that can be transferred to electronic products they are working on or are in contact with and can potentially result in degraded operation or destruction. Some junctions in integrated circuits can have the doping structure in their lattices that can be dramatically altered and effectively destroyed by as little as a 50 volt potential and this can negatively impact the entire integrated circuit. Static electricity can generate potentials on a person that are orders of magnitude higher than 50 volts arising from actions as simple and common as a person walking across a carpet. Thus, it is important for companies working with electronic circuits to have ESD control programs in place.

SUMMARY

An ESD tester is disclosed. The ESD tester includes an input block array with at least one input block. The at least one input block includes a jack receptacle configured to accept a banana plug of an anti-static strap and reject a human finger, a voltage/ground selection module operatively coupled to the input block array to provide an adjustable supply voltage, and a microprocessor configured to control the voltage/ground selection module to set the adjustable supply voltage provided to the at least one input block.

An input block of an ESD tester configured to reject a human finger is provided. The input block may have a switch configured to selectably connect and disconnect a jack receptacle to an internal test node, a resistor connected to adjustable voltage supply rail controlled by a voltage/ground selection module to bias the internal test node, a filtering capacitor connected to the internal test node to filter the internal test node, and an amplifier connected to the internal test node to measure a first voltage present on the internal test node. The switch may connect the jack receptacle to the internal test node to test the operative status of an anti-static strap and may disconnect the jack receptacle from the internal test node to test a calibration of the input block.

An operative use sequence for an anti-static strap tester is discussed. The operative use sequence can include performing an ESD tester functional calibration check to generate a calibration indication, performing an anti-static strap functional check after the ESD tester functional calibration check in response to the calibration indication indicating an acceptable calibration, and rejecting, concurrent with the anti-static strap functional check, the insertion of an unwanted article into a receptacle. The order of the two performing steps may be reversed in further instances so that both checking steps are performed, then the outcome of the anti-static strap functional check is retained or discarded based on the calibration indication.

A receptacle of an input block of an ESD tester configured to reject a human finger is included. The receptacle may have a non-conductive cover over a jack receptacle, the non-conductive cover having an opening defined through the non-conductive cover. The jack receptacle is configured to receive a plug in an electrical connection, and the opening may have a conically shaped aperture defined through the non-conductive cover and configured to guide a plug into the jack receptacle and reject a human finger from contacting the jack receptacle.

BRIEF DESCRIPTION OF DRAWINGS

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

Embodiments are illustrated by way of example in the accompanying figures not necessarily drawn to scale, in which like numbers indicate similar parts, and in which.

DETAILED DESCRIPTION OF THE DRAWINGS

Figure 1:
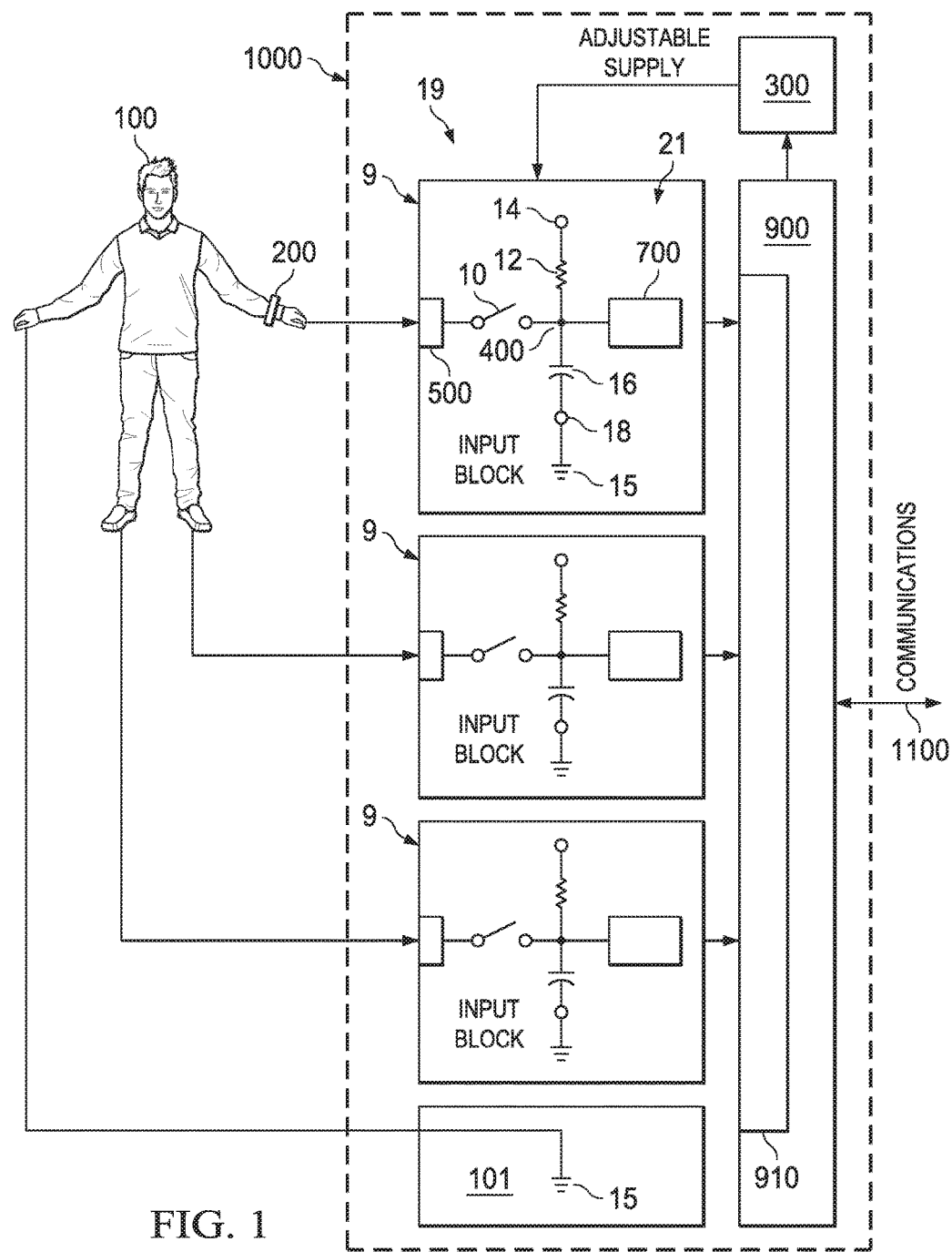
FIG. 1 shows a schematic of an ESD tester and user with wrist/foot strap.

In many scenarios (especially with seated operators), even with defensive mechanisms such as anti-static flooring and grounded work surfaces, the effective way to try to eliminate ESD damage (i.e. static charging on people) is to ground the operators by using a wrist strap and cord. The well-known wrist strap system has a band and a coil cord that is electrically connected to a common point ground. When functioning correctly the wrist strap ESD control method can reduce voltages on people to 10 volts and less.

Often operators are moving, testing and handling products and equipment while standing and an effective way to try to eliminate ESD damage is through the use of foot straps or other ESD footwear that are used in conjunction with properly installed ESD flooring systems, floor mats and/or special wax. As with wrist straps, foot straps or footwear can keep voltage build-up on operators at safe levels to help in preventing ESD damage.

Taken together or separately, wrist straps and foot straps (or footwear) make for an ESD protection system which works well when operating correctly. Unfortunately the wrist/foot strap system is also the most likely part of an ESD control program to fail over time. This is because there are numerous potential failure points such as a dirty cuff interior, a broken wire in the coil cord and either a strap too loose or improperly placed resulting in poor contact with the user's skin or a user that has high skin resistance. Accordingly, businesses using wrist/foot strap ESD control systems need to be very diligent about constant monitoring to assure that their system is still in good working order with all operators properly grounded when wearing their wrist/foot straps.

One method used to make sure that a wrist/foot strap system is working over time is for the operator to use an ESD test station. These ESD testing stations may function with a standard wrist strap and coil cord having a banana jack connector and/or with standard heel grounders. Many businesses require their operators to use an ESD test station on a regular basis (perhaps even multiple times per day). ESD test stations, when working properly, can read the resistances of the wrist/foot strap system (including the operator) and, from these measurements, provide a pass/fail indication. In more advanced testers it gives the operator the actual resistance levels and in some cases even trend analysis so that an operator can tell when his wrist/foot system is about to fail.

However even with the best test systems, no matter how many times an operator tests, there is still a risk the wrist/foot strap system will fail and expensive product may be compromised. This risk is increased when the test system itself is compromised. There are two primary ways that a test system can be compromised. One problem with ESD test systems is that over time they may become out of calibration. In such cases, even very diligent operators who have done everything right might inadvertently damage product because the test system has falsely communicated to the operator that the operator was within acceptable resistance measurements.

Accordingly, ESD testing equipment historically requires periodic calibration tests to verify that the testing device is operating within normal parameters. This process requires that the equipment in question be taken off line, packaged and shipped to a testing facility. Alternatively, the equipment in question may be calibrated by a qualified technician who has traveled to the equipment. Both of these calibration processes cost time and money. But, even worse, with periodic calibration testing, if there is a failure in the interim period there is no way to know how long the equipment has been providing false data and results. And this means that the ESD test equipment may have been putting the company's product at risk with field returns and latent failures.

Another common problem with test systems is operators that bypass the test system altogether so that no actual test on the wrist/foot strap system has been made. Operators may bypass the system by not sticking the banana jack connector into the test system and instead fooling the system by inserting one of their digits (e.g. a finger or thumb) in the test system and another of their digits into the grounding pad. Bypassing the system is not uncommon because some operators don't believe or understand that they may be potentially causing problems. This can turn into a very large problem that isn't discovered until later since the average person cannot sense a static electrical discharge of less than a few thousand volts. Without effective testing an operator may be unknowingly harming integrated circuits that go out into the field and aren't discovered until later at great cost.

Consequently, there is a need for an ESD wrist/foot strap test system that automatically tells an operator that the system is out of calibration so that an improperly functioning test system is never used by an operator thus assuring that the test data being reported is correct. Most desirable is a system that allows the ESD tester to self-validate itself.

What is further needed is a self-validating wrist/foot strap test system that does not require any user action beyond what the user normally does and is fast enough that it can be executed after, before or during each and every test.

What is also needed is an ESD wrist/foot strap system that makes it very difficult for operators to bypass the system by not plugging the wrist strap connector into the ESD test device.

Referring now to FIG. 1, the testing device is in some superficial ways typical of many ESD testing devices used to test the wrist/foot strap systems. Shown in FIG. 1 are four input blocks 9 with dashed lines representing testing points from wrist strap, foot straps (ESD footwear), and/or ESD-safe garments. The top input block 9 in FIG. 1 shows a connection to a wrist strap (anti-static strap 200) along with added details and reference numbers to aid in the discussion that follows. Note that the circuitry in all the input blocks 9 is identical and their operation when connected to foot straps (ESD footwear) and ESD-safe garments is the same as for the wrist strap. For simplicity, only the wrist strap and its testing are discussed and a like discussion is being inferred for the other input blocks 9. One or more of the inputs have a receptacle that accepts a banana plug, such as from a wrist strap or ESD garment.

As shown in FIG. 1, person 100 is wearing the anti-static strap 200 during the workday of person 100. The wearing of anti-static strap 200 is to help assure that person 100 (when combined with anti-static strap 200) has a resistance that is in a range where person 100 is highly unlikely to have an electrical potential (i.e. static electricity) high enough to cause ESD damage.

For a typical ESD wrist/foot strap tester to measure the combined resistance of a person and wrist strap (the key to understanding the possibility of ESD damage), it is known in the art to use a testing device having a resistor with a known resistance, a constant voltage source and then using a voltage divider circuit calculation to calculate the resistance of the person and wrist strap combination. This is done by plugging the wrist strap into the ESD tester, putting a constant voltage across the entire circuit and then calculating the resistance of the human/wrist strap combination by using Ohm's law and the knowledge of the voltage drop across the known resistor. Such wrist strap testers are commercially available such as U Line's 746 Wrist Strap Tester (model number S-13044). When the test shows that the person with the wrist strap has an acceptable resistance the possibility of the person damaging electronics because of ESD is severely reduced or eliminated.

However, standard wrist/foot strap testers from time to time can go out of calibration and give false readings. This could be caused by changes in the constant voltage generator, the known resistor or even the voltage testing electronics itself.

The wrist/foot strap tester disclosed herein has the possibility of going out of calibration from time to time as well, but it additionally has the capability of automatically checking itself to assure that, if it does go out of calibration, it notifies the operator that it is out of calibration.

With reference now to FIG. 1, an ESD tester 1000 is provided. An ESD tester 1000 comprises an apparatus configured to evaluate the anti-static strap 200 of a person 100, such as a wrist strap or a foot strap to determine whether the strap provides effective anti-static protection. For example, tester 1000 may determine whether the anti-static strap 200 exhibits a resistance or an impedance within an acceptable range, and/or indicates a resistance trend or an impedance trend over time that does or does not indicate a potential imminent failure.

Tester 1000 may include various subcomponents. For instance, tester 1000 may include an input block array 19. An input block array 19 may include one or more input block 9 (such as first input block, second input block, third input block, and any number N of input blocks 9). In various embodiments, N equals three, such that tester 1000 includes an input block array 19 with three input blocks 9. Each input block 9 may be in communication with various other aspects of the ESD tester 1000.

Figure 5:
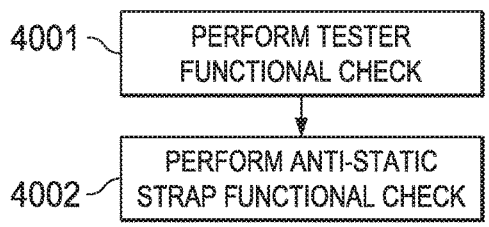
FIG. 5 shows an operative use sequence.

Tester 1000 may include a return path 101. A return path 101 may comprise a connection to ground 15. For instance, one or more conductive pad, for instance a conductive gold pad may be associated with the ESD tester 1000. A user may at various instances, such as during all or part of an operative use sequence 4000 (FIG. 5), contact the return path 101, such as by touching the conductive gold pad with a digit. In this manner, the circuit, as depicted in FIG. 1, may be completed. In further embodiments, a user 100 may stand on a pad, or may touch a pad, or may otherwise join in electrical continuity with the return path 101 comprising a connection to ground 15.

Each input block 9 of the input block array 19 may be in communication with a microprocessor 900. Microprocessor 900 may comprise a processor and memory configured to receive data and/or analog signals from the input block array 19 indicative of an aspect of an anti-static strap 200, for instance, a resistance. Microprocessor 900 may provide a quality indication via a communication bus 1100 so that a user may be alerted to the status of the anti-static strap 200. Moreover, microprocessor 900 may be in operative communication with a voltage/ground selection module 300 discussed further herein, whereby an adjustable supply voltage is supplied to each input block 9 of the input block array 19.

A voltage/ground selection module 300 may receive instructions from a microprocessor 900 and provide an adjustable supply, such as an adjustable voltage and/or current supply to the input blocks 9 of the input block array 19.

Turning in greater detail now to aspects of an input block 9, each input block 9 may include a receptacle 500 for electrically connecting the anti-static strap 200 to tester 1000. Each input block 9 may further include measurement circuitry 21. Measurement circuitry 21 may include a switch 10 that is selectably operable, for example, a relay or a solid state switch such as a transistor, that can either link or isolate an external test point, such as anti-static strap 200 (typically while being worn by a person 100) to/from other circuitry of the input block 9, such as measurement circuitry 21. Measurement circuitry 21 may also include a resistor 12 (R1) that biases an internal test point 400 to an adjustable voltage supply rail 14 provided by the voltage/ground selection module 300. Furthermore, measurement circuitry 21 may include a capacitor 16 (C1) configured to filter the input test point. In various embodiments, capacitor 16 interconnects between internal test point 400 and a second voltage rail 18, such as a ground 15. In this manner, the internal test point 400 may be filtered by the capacitor 16, such as to shunt higher frequency noise to ground, filtering induced noise such as may be coupled from a surrounding environment. Finally, internal test point 400 is connected to an amplifier circuit 700. In various embodiments, measurement circuitry 21 may include amplifier circuit 700, which comprises an operational amplifier ("Op-Amp"). Amplifier circuit 700 may receive a signal, such as a voltage signal from the internal test point 400 and may provide it to the microprocessor 900 for subsequent processing and evaluation.

Turning now in greater detail to aspects of microprocessor 900, the microprocessor 900 may include an analog-to-digital converter 910, such as an integrated multichannel analog-to-digital converter. Analog-to-digital converter 910 may receive an analog voltage value from each amplifier circuit 700 of each input block 9 and may generate a corresponding digital value representative of the analog voltage value. Microprocessor 900 may perform further operations in and in response to this digital value, such as to provide a quality indication via a communication bus 1100. Moreover, microprocessor 900 may further be operatively coupled to switch 10. Microprocessor 900 may operatively control the switch 10, connecting and disconnecting the internal test point 400 with receptacle 500. Moreover, microprocessor 900 may operatively control the voltage/ground selection module 300. For instance, microprocessor 900 may direct the voltage/ground selection module 300 to adjustably provide an adjustable supply voltage to an input block 9 of the input block array 19. In various instances, microprocessor 900 may direct the voltage/ground selection module 300 to provide a different adjustable voltage to different input blocks 9. Moreover, microprocessor 900 may direct the voltage/ground selection module 300 to adjustably provide an adjustable impedance and/or resistance to an input block 9 of the input block array 19. In various instances, microprocessor 900 may direct the voltage/ground selection module 300 to provide a different adjustable impedance and/or resistance to different input blocks 9. In this manner, the voltage, impedance, and/or resistance provided to the resistor 12 (operable as a bias resistor) may be controlled, as the voltage/ground selection module 300 may be operatively coupled to the input blocks 9 of the input block array 19 so as to provide the adjustable voltage supply rail 14 of each input block 9.

Figure 3:
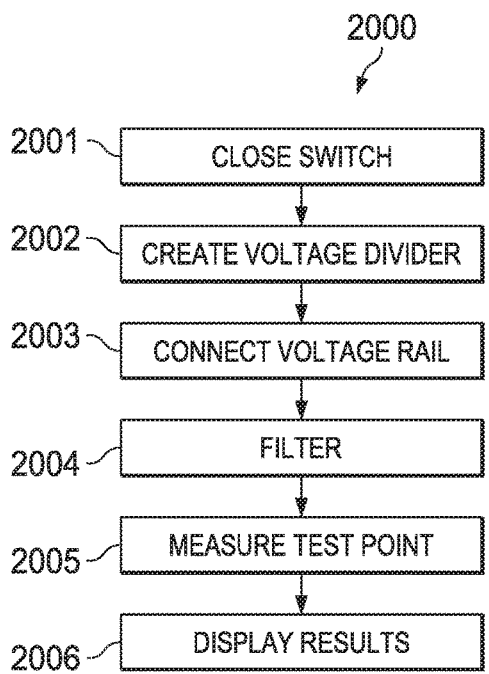
FIG. 3 shows an anti-static strap functional check method.

With additional reference to FIG. 3, during normal operation, tests are initiated by the user and the combination of person 100 (and their garments) and anti-static strap 200 are tested by the following steps. Stated differently, an anti-static strap functional check 2000 may include various steps. For instance, (1) Switch 10 is closed and this connects person 100 and anti-static strap 200 to tester 1000 (step 2001). (2) Resistor 12 (R1) and the combination of anti-static strap 200 and person 100 create a voltage divider circuit measured at internal test point 400 (Step 2002). (3) Voltage/Ground selection module 300 connects resistor 12 (R1) to a positive voltage rail set to a positive test voltage provided at adjustable voltage supply rail 14 (Step 2003). The positive test voltage may be provided by the same rail that the analog-to-digital converter 910, such as the integrated multichannel analog-to-digital converter, on microprocessor 900 utilizes as a reference, retaining a ratiometric circuit. (4) Capacitor 16 (C1) acts as a filter capacitor (Step 2004). The capacitor 16 may be chosen for stability over temperature and time to enhance useful life. (5) The internal test point 400 is measured by amplifier circuit 700 and microprocessor 900 with analog-to digital-converter (ADC) 910, such as an integrated multi-channel analog-to digital-converter (Step 2005). (6) Measured results of the test results showing the resistance and/or impedance of the anti-static strap 200 (e.g., wrist straps, foot straps and garment test results) are compared with acceptable ranges for safe ESD handling, and tester 1000 displays those results as well as retains the data as test records (Step 2006). Various steps may occur in a variety of sequences or in parallel.

Referring again to FIG. 1, either immediately before or immediately after a test is run on person 100 using anti-static strap 200, tester 1000 may automatically runs a calibration test to see if tester 1000 remains consistent with the calibration made at the factory when tester 1000 was approved. This is done by microprocessor 900 opening the switch 10 so that tester 1000 is isolated from any outside electrical influences. The ESD tester 1000 then runs tests that check the RC time response of resistor 12 (R1) and capacitor 16 (C1) remain within a predetermined RC Time calibration range to assure that the ESD tester 1000 is still calibrated.

The RC time response is a known voltage curve that results as the capacitor 16 (C1) is either charged or discharged through resistor 12 (R1). For instance, capacitor 16 (C1) may be charged via adjustable voltage supply rail 14 and discharged via ground (second voltage rail 18). Capacitor 16 (C1) may be a type of capacitor that is very stable and exhibits little or no change in capacitance with respect to time and voltage, and a little or no change in capacitance with reference to ambient temperature. By verifying the response of the circuitry of the input block 9 against the expected RC response curve and further by doing this validation each time an anti-static strap 200 is tested, the ESD tester 1000 is able to assure that the input circuitry is providing accurate readings or else detect that test results may be questionable and indicate an alert via communication bus 1100, such as corresponding to a flag alerting an ESD system administrator of that possibility.

Figure 4:
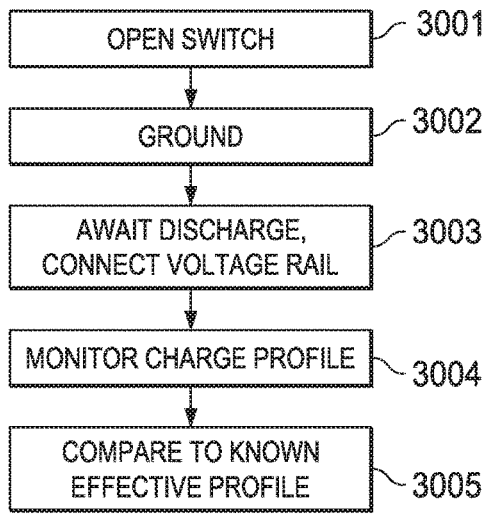
FIG. 4 shows an ESD tester functional calibration check method.

With additional reference to FIG. 4, during a calibration check the following steps are performed. Stated differently, an ESD tester functional calibration check 3000 may include various steps. For instance, (1) Switch 10 is opened, isolating any external influence from the measurement circuitry 21 (Step 3001). (2) Voltage/Ground selection module 300 connects resistor 12 (R1) to zero VDC at adjustable voltage supply rail 14 (i.e. ground), thus discharging the capacitor 16 (C1) (Step 3002). (3) microprocessor 900 waits for capacitor 16 (C1) to discharge and then microprocessor 900 changes Voltage/Ground selection module 300 to pull the resistor 12 (R1) to a low impedance positive rail at adjustable voltage supply rail 14 (Step 3003). (4) Microprocessor 900 then monitors and records the progression of the capacitor 16 (C1) charge profile at internal test point 400 (step 3004) and compares said profile against a known effective profile and determines if the profiles match to some predetermined level of accuracy (Step 3005). If the profiles match to some predetermined level of accuracy, tester 1000 is validated as operating correctly. In other words, when a test profile matches a known good profile, this verifies that resistor 12 (R1), capacitor 16 (C1), amplifier circuit 700, microprocessor 900 and Voltage/Ground selection module 300 are in good working order.

These calibration tests are performed in close temporal proximity to a test of anti-static strap 200 and person 100 in order to assure in real time or substantially real time (i.e. during an actual ESD test) that tester 1000 is still accurate. In other words, with additional reference to FIG. 5, an operative use sequence 4000 may include an ESD tester functional calibration check 3000 (step 4001) performed in close temporal proximity to an anti-static strap functional check 2000 (step 4002) in order to assure in real time or substantially real time (i.e. during an actual ESD test) that tester 1000 is still accurate, rejecting concurrent with the anti-static strap functional check 2000, entry of an unwanted article into a receptacle 500. The unwanted article may be a finger, or other body part, or object other than that intended to be tested (anti-static strap 200) In various embodiments, the ESD tester functional calibration check 3000 is performed and afterward, the anti-static strap functional check 2000 is performed.

Once the ESD tester 1000 has measured the anti-static strap 200 and person 100 and a calibration check has been executed, tester 1000 then processes the data. If tester 1000 determines that it is out of calibration, tester 1000 communicates with the user that it is not operational, such as via a display in operative communication with communication bus 1100. If tester 1000 has been found to be in calibration, validated test results are compared with predetermined values that are considered acceptable. Tester 1000 at this point may communicate an operative status of the anti-static strap 200, such as pass/fail data with the user, communicate detailed test data with the user, store user information and results, and make gathered data available for remote access.

Examples of commercially available components for at least one embodiment of the disclosure have been provided herein. However, these examples of commercially available components are non-exclusive and in no way should be interpreted as limiting, in any way, the claims of the invention. For example, microprocessor 900 may be a Microchip PIC16F946-I. In various embodiments a microprocessor 900 with an analog-to-digital converter 910, such as an integrated multichannel analog-to-digital converter, is used; however, in further embodiments an external ADC may be used. Moreover, the amplifier circuit 700 may be a Texas Instruments LMC6482IM. In various embodiments, the amplifier circuit 700 may be a rail to rail input and output op-amp. Moreover, in various embodiments, an op-amp with very low input current is adopted. Furthermore, capacitor 16 (C1) may be a 0.015 uF capacitor (1% tolerance). In various embodiments, the capacitor 16 (C1) is a Kemet C0603C153F3CACTU 0.015 uF 1% 25V COG/NPO. Moreover, resistor 12 (R1) may comprise a 5 Meg Ohm resistor, or may comprise other values, for instance, five 1 Meg Ohm resistors in series. Resistor 12 (R1) may comprise five TE 1-1879417-9 1 Meg Ohms 0.1% tolerance resistors in a series circuit. Switch 10 may be a relay. In various instances, switch 10 is a Kemet EE2-5NU-L relay.

Figure 2:
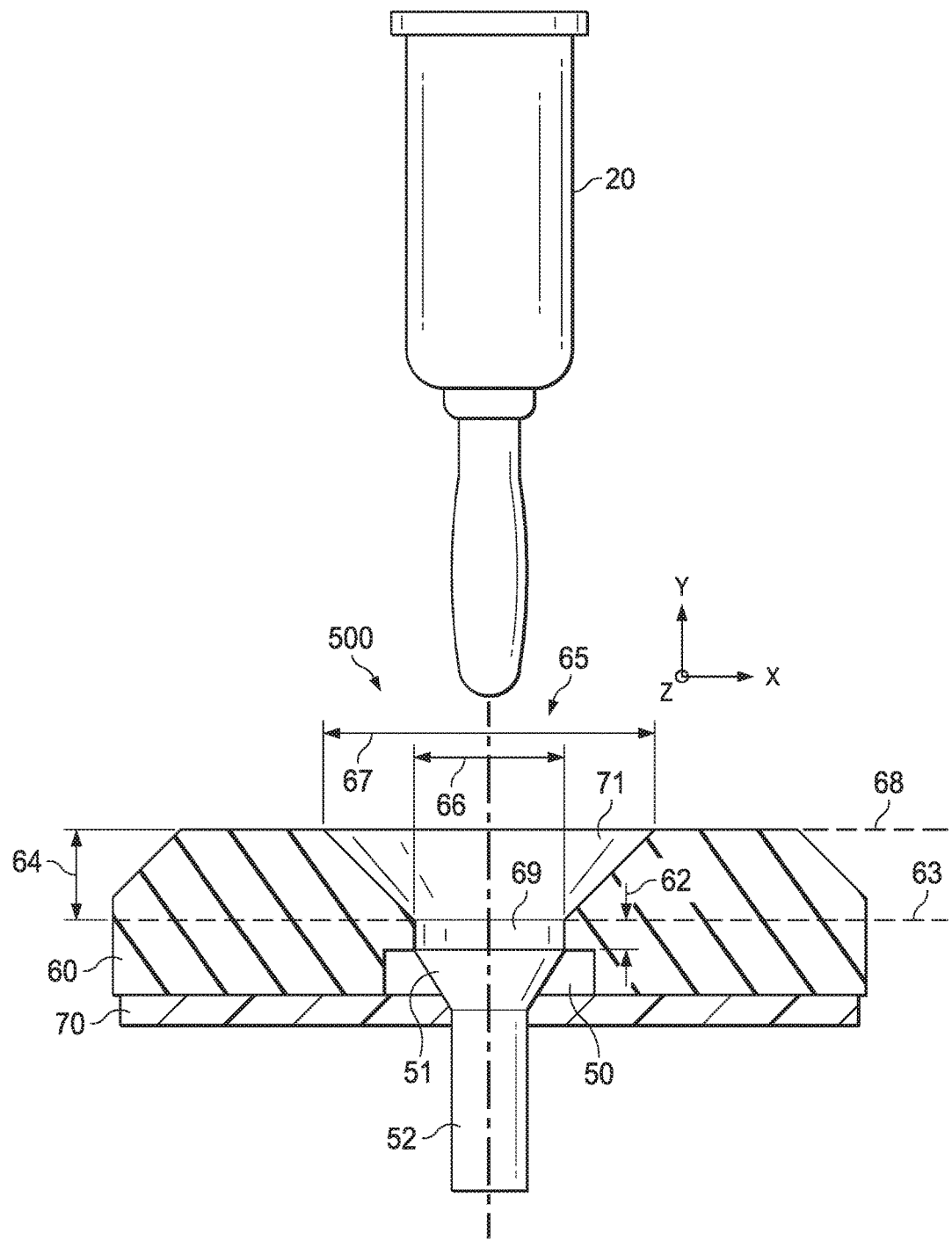
FIG. 2 shows a cross section of the receptacle from the ESD tester and a plug from a wrist or foot strap.

Turning now to FIG. 2, disclosed is a cross section of receptacle 500 from FIG. 1 and banana plug 20 that is used to electrically connect anti-static strap 200 to tester 1000. Receptacle 500 is where anti-static strap 200 from FIG. 1 is connected to tester 1000 as described above.

As discussed above, there are issues with the receptacles found in prior art ESD testers. First, at times it can be difficult for the operator (person 100 in FIG. 1) to insert banana plug into a receptacle because the fit between the female portion of standard receptacles and the male portion of standard banana plugs is a tight fit and thus the operator must be very precise when inserting the plug into the receptacle. When operators are forced to do this multiple times per day this requirement for precise placement can be annoying and perhaps even time consuming.

Second, it is known that from time to time some operators bypass the test system altogether by not placing the wrist band plug into the ESD tester receptacle. In these instances no valid test on the wrist/foot strap band system has been made. Operators may bypass the system by not sticking the wrist band plug into the test system and instead fooling the system by inserting one of their digits (e.g. a finger or thumb) in the test system. As discussed above, this can turn into a very large problem that isn't discovered until later when product starts failing in the field.

To fix these two problems, we disclose a newly designed receptacle 500 that is comprised of non-conductive cover 60 over PCB 70 and jack receptacle 50. In order to allow banana plug 20 to be inserted into jack receptacle 50 there is an opening 65 in non-conductive cover 60. Opening 65 is conically shaped aperture defined through the non-conductive cover 60 so that the mouth of opening 65 is wide enough for an operator to more easily insert the banana plug 20 into jack receptacle 50. The conical shape of opening 65 then guides the banana plug 20 into the jack receptacle 50 which is narrower than the opening 65.

For example, the opening 65 may comprise an outer width 67 comprising an aperture defined through the non-conductive cover 60 lying in a plane comprising an outer threshold plane 68. The outer threshold plane 68 may lie coincident with the distal (e.g., outermost in the positive Y-axis direction as defined in FIG. 2) boundary of the non-conductive cover 60. The opening 65 may comprise a conic portion 71 extending inwardly from the opening 65. The opening 65 may further define the aperture having an inner width 66 at the narrowest point of the conic portion 71, lying in a transition region plane 63 and denoting a transition to a cylindrical portion 69. The opening 65 may comprise a cylindrical portion 69 comprising an aperture defined through the non-conductive cover 60 lying inwardly of the conic portion 71 and extending a first cylindrical portion distance 62 inwardly and abutting the jack receptacle 50. Thus, the conic portion 71 may extend a first conic portion distance 64 defined parallel to a central longitudinal axis 61 of the conic portion 71 and the cylindrical portion 69. The cylindrical portion 69 may extend a first cylindrical portion distance 62 defined parallel to a central longitudinal axis 61, inwardly from the transition region plane 63 to the jack receptacle 50.

The jack receptacle 50 may comprise a conic jack portion 51 inward of the cylindrical portion 69 of the non-conductive cover 60, and further comprise a cylindrical jack portion 52 further inwardly of the conic jack portion 51.

The diameter of the outer width 67, or stated otherwise, the mouth of opening 65, is between 17 to 19 millimeters (mm) and more preferably from 17.88 to 18.28 millimeters. The thickness of non-conductive cover 60 or stated otherwise, the sum of the first conic portion distance 64 and the first cylindrical portion distance 62 is between 9 to 10 mm and more preferably from 9.3 mm to 9.6 mm. This thickness makes it possible to have the mouth of opening 65 to be as wide as is practical for ease of insertion. This thickness also serves a second purpose. With the thickness of non-conductive cover 60 between 9.4 to 9.6 millimeters and the diameter of the outer width 67, or stated otherwise, the diameter of the mouth of opening 65 between 18.1 to 18.6 millimeters, it is impossible for an operator to stick a finger or thumb into jack receptacle 50 and thus bypass the ESD tester 1000.

With reference now to the combination of all FIGS. 1 through 5, having discussed generally various aspects and uses of the disclosed system, apparatus and methods, various embodiments and use scenarios are discussed in specific detail below. For example, an ESD tester 1000 may include an input block array 19 comprising at least one input block 9. The at least one input block 9 comprises a jack receptacle 50 configured to accept a banana plug 20 of an anti-static strap 200 and reject a human finger. A voltage/ground selection module 300 is operatively coupled to the input block array 19 to provide an adjustable supply voltage and a microprocessor 900 is configured to control the voltage/ground selection module 300 to set the adjustable supply voltage provided to the at least one input block 9.

Discussing the input block 9 specifically, each input block 9 may have various components forming a measurement circuit. There may be a switch 10 configured to selectably connect and disconnect a jack receptacle 50 to an internal test node. A resistor 12 is connected to an adjustable voltage supply rail 14 controlled by the voltage/ground selection module 300 to bias the internal test node. A capacitor 16 is connected to the internal test node to filter the internal test node. Furthermore, an amplifier is connected to the internal test node to measure a first voltage present on the internal test node. As the input block 9 operates, the switch 10 can be controlled to connect the jack receptacle 50 to the internal test node to test the operative status of an anti-static strap 200 connectable to the jack receptacle 50 and disconnects the jack receptacle 50 from the internal test node to test a calibration of the input block 9. The operative status may be whether a resistance, impedance, resistance trend, and/or impedance trend indicates a current or imminent failure of the anti-static strap 200 to discharge static charge accumulation during use. A calibration of the input block 9 may be in indication of whether the input block 9 is still operating according to known parameters, such as the capacitor 16 and resistor 12 remaining within proscribed tolerances, so that the data collected from the input block 9 is properly representative of the actual operative status of the anti-static strap 200.

To effectuate these functions, the ESD tester 1000 may also have an analog-to-digital converter 910 connecting the internal test node to the microprocessor 900, whereby the microprocessor 900 monitors a voltage on the internal test node and controls the adjustable voltage supply rail 14 via the voltage/ground selection module 300. Furthermore, a communication bus 1100 couples to the microprocessor 900, and the microprocessor 900 determines at least one of the resistance, the impedance, the resistance trend, and the impedance trend of the anti-static strap 200. The microprocessor 900 also outputs this operative status, for instance, a pass/fail indication, on the communication bus 1100.

It is important to note, that the input block 9 of the ESD tester 1000 is configured to reject a human finger so that users are not able to easily bypass or defeat its testing aspects. Repeating aspects of the discussion above for specific clarity regarding such an input block 9, the input block 9 can have components such as a switch 10 configured to selectably connect and disconnect a jack receptacle 50 to an internal test node, a resistor 12 connected to adjustable voltage supply rail 14 controlled by a voltage/ground selection module 300 to bias the internal test node, and again, a capacitor 16 connected to the internal test node to filter the internal test node. Also connecting to the internal test node, an amplifier works to measure a first voltage present on the internal test node. Notably, the switch 10 connects the jack receptacle 50 to the internal test node to test the operative status of an anti-static strap 200 and disconnects the jack receptacle 50 from the internal test node to test a calibration of the input block 9, as has been discussed.

This input block 9 can also have a second voltage rail 18 connected to the capacitor 16. This establishes a series circuit comprising the adjustable voltage supply rail 14, the resistor 12, the internal test node, the capacitor 16 and the second voltage rail 18 that conducts a first current. The switch 10 connects the jack receptacle 50 to the internal test node. Thus, a second current path is formed through the jack receptacle 50 from the internal test node, to an anti-static strap 200 connected to the jack receptacle 50, then through the person 100's body and to a current sink, such as to ground. Thus, a second current is sinked through the jack receptacle 50. Also, the first voltage present on the internal test node. Consequently, the sum of the first current plus the second current is provided by the adjustable voltage supply rail 14 in response to a microprocessor 900, wherein the microprocessor 900 is connected to the amplifier to measure the first voltage present on the internal test node. The first current and the second current are sinked, and contribute, based on principles of resistance and/or impedance, to the magnitude of the first voltage, which can be measured, as mentioned.

The operative status that is on the communication bus 1100 is responsive to the performance of an operative use sequence 4000. The operative use sequence 4000 can have an anti-static strap functional check 2000 followed by an ESD tester functional calibration check 3000. Alternatively, the operative use sequence 4000 can have an ESD tester functional calibration check 3000 followed by an anti-static strap functional check 2000. In one instance, the operative use sequence 4000 proceeds by performing an anti-static strap functional check 2000 to indicate the operative status of the anti-static strap 200, performing an ESD tester functional calibration check 3000 after the anti-static strap functional check 2000 to generate a calibration indication, rejecting, concurrent with the anti-static strap functional check 2000, the insertion of the human finger into the receptacle 500, and rejecting the operative status in response to the calibration indication indicating an unacceptable calibration. A calibration indication may be in indication of whether the input block 9 is still operating according to known parameters such as the capacitor 16 and resistor 12 remaining within proscribed tolerances, so that the data collected from the input block 9 is properly representative of the actual operative status of the anti-static strap 200. The calibration indication may be a binary pass/fail indication, or may include trend information or measured data for further processing by human judgment or by machine protocols.

In further embodiments, an operative use sequence 4000 for an anti-static strap 200 tester 1000 includes performing an ESD tester functional calibration check 3000 to generate a calibration indication, performing an anti-static strap functional check 2000 after the ESD tester functional calibration check 3000 in response to the calibration indication indicating an acceptable calibration, and rejecting, concurrent with the anti-static strap functional check 2000, the insertion of an unwanted article into a receptacle 500. Thus as mentioned, the sequence of steps may be varied.

Elaborating further, the ESD tester functional calibration check 3000 has its own specific steps, such as opening, by the microprocessor 900, a switch 10 to isolate a receptacle 500 from an internal test node, connecting, a resistor 12 coupled to the internal test node to an adjustable voltage supply rail 14 set to 0 VDC to discharge a capacitor 16 coupled to the internal test node, and subsequent to the discharging the capacitor 16, setting the adjustable voltage supply rail 14 to a positive voltage. Additionally, the microprocessor 900 may monitor and record the trend of a voltage at the internal test node connecting the resistor 12 to the capacitor 16, whereby a charge profile of the capacitor 16 is detected. A charge profile is the voltage over time and/or current over time curve associated with the capacitor 16 as can be described by a RC time constant relationship. The microprocessor 900 may have stored a known effective profile, meaning a charge profile exhibited when the ESD tester 1000 is operating correctly, such as with components with values inside known tolerance ranges. Thus, the method includes comparing, by the microprocessor 900, the charge profile to a known effective profile, whereby correct operation of a measurement circuitry 21 is validated.

A similar discussion of the anti-static strap functional check 2000 is warranted. The anti-static strap functional check 2000 has its own specific steps. For instance, such steps include closing, by the microprocessor 900, the switch 10 to connect the anti-static strap 200 coupled to the receptacle 500 to the internal test node, connecting the resistor 12 to the adjustable voltage supply rail 14 set to a positive test voltage, filtering, by the capacitor 16 a signal on the internal test node, and measuring, by an amplifier circuit 700 coupled to the microprocessor 900, the voltage at the internal test node. These steps conclude with comparing, by the microprocessor 900, the voltage at the internal test node to an acceptable range whereby at least one of the resistance and impedance of the anti-static strap 200 is determined.

Shifting attention to the physical connection to the input block 9, various aspects which have already been discussed above are reiterated below for clarity with respect to one potential arrangement. One such arrangement is to include in the receptacle 500 a non-conductive cover 60 over a jack receptacle 50, the non-conductive cover 60 comprising an opening 65 defined through the non-conductive cover 60. The jack receptacle 50 is configured to receive a plug, such as a banana plug 20 of an anti-static strap 200, in an electrical connection. The opening 65 comprises a conically shaped aperture defined through the non-conductive cover 60 and configured to guide a plug into the jack receptacle 50 and reject a human finger from contacting the jack receptacle 50.

The non-conductive cover 60 defines an aperture lying in an outer threshold plane 68 coincident with the distal boundary of the non-conductive cover 60 and having an outer width 67. Also, a conic portion 71 extends inwardly from the outer threshold plane 68 to a transition region plane 63 disposed at a narrowest point of the conic portion 71 having an inner width 66. In such an instance, a cylindrical portion 69 extends inwardly of the conic portion 71 a first cylindrical portion distance 62 and abuts the jack receptacle 50, and the first conic portion distance 64 and the first cylindrical portion distance 62 are defined parallel to a central longitudinal axis 61 inwardly toward the jack receptacle 50.

Shifting attention now to the jack receptacle 50 portion of the portion more broadly termed the receptacle 500, the jack receptacle 50 has a conic jack portion 51 inward of the cylindrical portion 69 of the non-conductive cover 60 and a cylindrical jack portion 52 inward of the conic jack portion 51. The specific dimensions can be the outer width 67 being between 17.88 to 18.28 mm, and the sum of the first conic portion distance 64 and the first cylindrical portion distance 62 being 9.3 to 9.6 mm. These dimensions, as mentioned previously, facilitate a finger being rejected from contacting the jack receptacle 50.

Particular embodiments of the receptacle 500 can be detailed as follows. A receptacle 500 of an input block 9 of an ESD tester 1000 configured to reject a human finger, the receptacle 500 can include certain features, such as a non-conductive cover 60 over a jack receptacle 50, the non-conductive cover 60 comprising an opening 65 defined through the non-conductive cover 60. The jack receptacle 50 may be configured to receive a plug in an electrical connection. The opening 65 comprises a conically shaped aperture defined through the non-conductive cover 60 and configured to guide a plug into the jack receptacle 50 and reject a human finger from contacting the jack receptacle 50.

Elaborating further, the non-conductive cover 60 can define an aperture lying in an outer threshold plane 68 coincident with the distal boundary of the non-conductive cover 60 and having an outer width 67, and a conic portion 71 can extend inwardly from the outer threshold plane 68 to a transition region plane 63 disposed at a narrowest point of the conic portion 71 having an inner width 66. Continuing focus inwardly, a cylindrical portion 69 extends inwardly of the conic portion 71 a first cylindrical portion distance 62 and abuts the jack receptacle 50, and the first conic portion distance 64 and the first cylindrical portion distance 62 are defined parallel to a central longitudinal axis 61 inwardly toward the jack receptacle 50. The jack receptacle 50 has two aspects, a conic jack portion 51 and a cylindrical jack portion 52. The conic jack portion 51 is inward of the cylindrical portion 69 of the non-conductive cover 60 and a cylindrical jack portion 52 is inward of the conic jack portion 51. Once again, the outer width 67 may be between 17.88 to 18.28 mm, the sum of the first conic portion distance 64 and the first cylindrical portion distance 62 comprises 9.3 to 9.6 mm, and a finger is rejected from contacting the jack receptacle 50.

The foregoing description has provided by way of exemplary and non-limiting examples a full and informative description of one or more exemplary embodiments of this invention. However, various modifications and adaptations may become apparent to those skilled in the relevant arts in view of this description when read in conjunction with the drawings and the claims. However, all such and similar modifications of the teachings of this invention will still fall within the scope of this invention as defined in the appended claims.

What is claimed is:

1. An ESD tester comprising:
    an input block array comprising at least one input block,
    wherein the at least one input block comprises a jack receptacle configured to accept a banana plug of an anti-static strap and reject a human finger;
    a voltage/ground selection module operatively coupled to the input block array to provide an adjustable supply voltage; and
    a microprocessor configured to control the voltage/ground selection module to set the adjustable supply voltage provided to the at least one input block;
    wherein each of the at least one input block comprises:
        a switch configured to selectably connect and disconnect the jack receptacle to an internal test node;
        a resistor connected to an adjustable voltage supply rail controlled by the voltage/ground selection module to bias the internal test node;
        a filtering capacitor connected to the internal test node to filter the internal test node; and
        an amplifier circuit connected to the internal test node to measure a first voltage present on the internal test node,
    wherein the switch connects the jack receptacle to the internal test node to test an operative status of an anti-static strap connectable to the jack receptacle and disconnects the jack receptacle from the internal test node to test a calibration of the input block.

2. The ESD tester according to claim 1, further comprising an analog-to digital-converter connecting the internal test node to the microprocessor, whereby the microprocessor monitors a voltage on the internal test node and controls the adjustable voltage supply rail via the voltage/ground selection module.

3. The ESD tester according to claim 2, further comprising:
    a communication bus coupled to the microprocessor,
    wherein the microprocessor is configured to determine at least one of a resistance, an impedance, a resistance trend, and an impedance trend of the anti-static strap and output the operative status comprising a pass/fail indication on the communication bus.

4. An input block of an ESD tester configured to reject a human finger, comprising:
    a switch configured to selectably connect and disconnect a receptacle comprising a jack receptacle to an internal test node;
    a resistor connected to adjustable voltage supply rail controlled by a voltage/ground selection module to bias the internal test node;
    a filtering capacitor connected to the internal test node to filter the internal test node;
    an amplifier circuit connected to the internal test node to measure a first voltage present on the internal test node;
    wherein the switch connects the jack receptacle to the internal test node to test an operative status of an anti-static strap and disconnects the receptacle from the internal test node to test a calibration of the input block.

5. The input block of the ESD tester according to claim 4, further comprising a second voltage rail connected to the filtering capacitor, and
    wherein a series circuit comprising the adjustable voltage supply rail, the resistor, the internal test node, the filtering capacitor and the second voltage rail conducts a first current.

6. The input block of the ESD tester according to claim 5, wherein the switch connects the jack receptacle to the internal test node, and
    wherein a second current is sinked through the jack receptacle, wherein the first voltage present on the internal test node.

7. The input block of the ESD tester according to claim 6, wherein a sum of the first current plus the second current is provided by the adjustable voltage supply rail in response to a microprocessor, wherein the microprocessor is connected to the amplifier circuit to measure the first voltage present on the internal test node.

8. The input block of the ESD tester, according to claim 7, wherein the operative status on a communication bus is responsive to a performance of an operative use sequence comprising:
    performing an anti-static strap functional check to indicate the operative status of the anti-static strap;
    performing an ESD tester functional calibration check after the anti-static strap functional check to generate a calibration indication;
    rejecting, concurrent with the anti-static strap functional check, insertion of the human finger into the receptacle; and
    rejecting the operative status in response to the calibration indication indicating an unacceptable calibration.

9. The input block of the ESD tester according to claim 7, wherein the receptacle comprises:
    a non-conductive cover over the jack receptacle, the non-conductive cover comprising an opening defined through the non-conductive cover,
    wherein the jack receptacle is configured to receive a plug in an electrical connection;
    wherein the opening comprises a conically shaped aperture defined through the non-conductive cover and configured to guide the plug into the jack receptacle and reject the human finger from contacting the jack receptacle.

10. The receptacle according to claim 9,
wherein the non-conductive cover defines an aperture lying in an outer threshold plane that is coincident with a distal boundary of the non-conductive cover and having an outer width,
wherein a conic portion extends inwardly from the outer threshold plane to a transition region plane disposed at a narrowest point of the conic portion having an inner width,
wherein a cylindrical portion extends inwardly of the conic portion a first cylindrical portion distance and abuts the jack receptacle, and
wherein a first conic portion distance and the first cylindrical portion distance are defined parallel to a central longitudinal axis inwardly toward the jack receptacle.

11. The receptacle according to claim 10, wherein the jack receptacle comprises:
a conic jack portion inward of the cylindrical portion of the non-conductive cover; and
a cylindrical jack portion inward of the conic jack portion.

12. The receptacle according to claim 11,
wherein the outer width comprises between 17.88 to 18.28 mm,
wherein the sum of the first conic portion distance and the first cylindrical portion distance comprises 9.3 to 9.6 mm, and
wherein a finger is rejected from contacting the jack receptacle.

13. An operative use sequence for an anti-static strap tester comprising:
performing an ESD tester functional calibration check to generate a calibration indication;
performing an anti-static strap functional check after the ESD tester functional calibration check in response to the calibration indication indicating an acceptable calibration, rejecting, concurrent with the anti-static strap functional check, insertion of an unwanted article into a receptacle,
wherein the ESD tester functional calibration check comprises:
opening, by a microprocessor, a switch to isolate the receptacle from an internal test node;
connecting, a resistor coupled to the internal test node to an adjustable voltage supply rail set to 0 VDC to discharge a capacitor coupled to the internal test node;
subsequent to the discharging the capacitor, setting an adjustable voltage supply rail to a positive voltage;
monitoring and recording, by the microprocessor a trend of a voltage at the internal test node connecting the resistor to the capacitor, whereby a charge profile of the capacitor is detected; and
comparing, by the microprocessor, the charge profile to a known effective profile, whereby correct operation of a measurement circuitry is validated.

14. The operative use sequence for the anti-static strap tester according to claim 13, wherein the anti-static strap functional check comprises:
closing, by the microprocessor, the switch to connect an anti-static strap coupled to the receptacle to the internal test node;
connecting the resistor to the adjustable voltage supply rail set to a positive test voltage;
filtering, by the capacitor a signal on the internal test node;
measuring, by an amplifier circuit coupled to the microprocessor, the voltage at the internal test node;
comparing, by the microprocessor, the voltage at the internal test node to an acceptable range whereby at least one of a resistance and an impedance of the anti-static strap is determined.

15. A receptacle of an input block of an ESD tester configured to reject a human finger, the receptacle comprising:
a non-conductive cover over a jack receptacle, the non-conductive cover comprising an opening defined through the non-conductive cover,
wherein the jack receptacle is configured to receive a plug in an electrical connection; and
wherein the opening comprises a conically shaped aperture defined through the non-conductive cover and configured to guide the plug into the jack receptacle and reject the human finger from contacting the jack receptacle,
wherein the non-conductive cover defines an aperture lying in an outer threshold plane that is coincident with a distal boundary of the non-conductive cover and having an outer width,
wherein a conic portion extends a first conic portion distance inwardly from the outer threshold plane to a transition region plane disposed at a narrowest point of the conic portion having an inner width,
wherein a cylindrical portion extends inwardly of the conic portion a first cylindrical portion distance and abuts the jack receptacle, and
wherein the first conic portion distance and the first cylindrical portion distance are defined parallel to a central longitudinal axis inwardly toward the jack receptacle.

16. The receptacle according to claim 15, wherein the jack receptacle comprises:
a conic jack portion inward of the cylindrical portion of the non-conductive cover; and
a cylindrical jack portion inward of the conic jack portion.

17. The receptacle according to claim 16,
wherein the outer width comprises between 17.88 to 18.28 mm, and
wherein a sum of the first conic portion distance and the first cylindrical portion distance comprises 9.3 to 9.6 mm,
whereby a finger is rejected from contacting the jack receptacle.

* * * * *